US010561005B1

(12) United States Patent
Peng

(10) Patent No.: US 10,561,005 B1
(45) Date of Patent: Feb. 11, 2020

(54) LIGHT EMITTING DIODE LAMP STRING SYSTEM WITH SEQUENCING FUNCTION AND SEQUENCING METHOD

(71) Applicant: Semisilicon Technology Corp., New Taipei (TW)

(72) Inventor: Wen-Chi Peng, New Taipei (TW)

(73) Assignee: SEMISILICON TECHNOLOGY CORP., New Taipei (TW)

( * ) Notice: Subject to any disclaimer, the term of this patent is extended or adjusted under 35 U.S.C. 154(b) by 0 days.

(21) Appl. No.: 16/419,901

(22) Filed: May 22, 2019

(51) Int. Cl.
*H05B 37/02* (2006.01)
*H05B 33/08* (2006.01)
*G01R 31/00* (2006.01)

(52) U.S. Cl.
CPC ....... *H05B 37/029* (2013.01); *H05B 33/0806* (2013.01); *H05B 33/0842* (2013.01)

(58) Field of Classification Search
CPC ...... H05B 37/02; H05B 37/029; H05B 37/03; H05B 33/08; H05B 33/0806; H05B 33/0842; H05B 33/0848; H05B 33/089; H05B 33/0893; G01R 31/00; G01R 31/26; G01R 31/2635
See application file for complete search history.

(56) References Cited

U.S. PATENT DOCUMENTS

| | | | | |
|---|---|---|---|---|
| 10,039,164 | B1 * | 7/2018 | Peng | H05B 33/083 |
| 10,314,137 | B1 * | 6/2019 | Lai | H05B 33/089 |
| 10,352,972 | B1 * | 7/2019 | Nayak | |
| 2004/0160199 | A1 * | 8/2004 | Morgan | A01M 1/04 315/312 |

* cited by examiner

*Primary Examiner* — Thai Pham
(74) *Attorney, Agent, or Firm* — Chun-Ming Shih; HDLS IPR Services

(57) ABSTRACT

A light emitting diode lamp string system with a sequencing function includes a light emitting diode driving apparatus and a light emitting diode lamp string. In a predetermined sequence testing mode, the light emitting diode driving apparatus sequentially sends a plurality of predetermined sequence testing signals to the light emitting diode lamp string to find out the damaged light emitting diode lamp. In an extended sequence testing mode, the light emitting diode driving apparatus respectively sends a plurality of extended sequence testing signals to the light emitting diode lamp string to find out the new light emitting diode lamp. A sequencing method performs a predetermined sequence testing mode to detect a failure address code, and performs an extended sequence testing mode to detect a replacement address code, and replaces the failure address code with the replacement address code in a testing sequence.

12 Claims, 8 Drawing Sheets

LIGHT EMITTING DIODE LAMP STRING SYSTEM WITH SEQUENCING FUNCTION AND SEQUENCING METHOD

BACKGROUND OF THE INVENTION

Field of the Invention

The present invention relates to a light emitting diode lamp string system and a method, and especially relates to a light emitting diode lamp string system with a sequencing function and a sequencing method.

Description of the Related Art

A related art light emitting diode lamp string system comprises a related art light emitting diode driving apparatus and a related art light emitting diode lamp string. The related art light emitting diode lamp string comprises a plurality of related art light emitting diode lamps. The related art light emitting diode lamps are electrically connected to each other. After the related art light emitting diode lamp string has been manufactured, each of the related art light emitting diode lamps comprises a local address code. The local address codes of the related art light emitting diode lamps are different. The related art light emitting diode lamps are arranged orderly based on the local address codes. For example, if the related art light emitting diode lamp string comprises 25 related art light emitting diode lamps, the 25 related art light emitting diode lamps comprise the local address codes 01, 02 . . . 25 respectively. The 25 related art light emitting diode lamps are arranged orderly based on the local address codes 01, 02 . . . 25.

The related art light emitting diode driving apparatus is used to drive the related art light emitting diode lamp string to light diversely. The method is as follows.

Firstly, the related art light emitting diode driving apparatus generates a related art driving lighting signal, wherein the related art driving lighting signal comprises a predetermined address code and a lighting code. Then, the related art light emitting diode driving apparatus sends the related art driving lighting signal to the related art light emitting diode lamps. All of the related art light emitting diode lamps receive the related art driving lighting signal. If the local address code of the related art light emitting diode lamp is the same with the predetermined address code of the related art driving lighting signal, the related art light emitting diode lamp lights based on the lighting code of the related art driving lighting signal. If the local address code of the related art light emitting diode lamp is not the same with the predetermined address code of the related art driving lighting signal, the related art light emitting diode lamp ignores the lighting code of the related art driving lighting signal.

For example, if the predetermined address code of the related art driving lighting signal is 05, the related art light emitting diode lamp having the local address code 05 lights based on the lighting code of the related art driving lighting signal. The rest of the related art light emitting diode lamps ignore the lighting code of the related art driving lighting signal. Therefore, the related art light emitting diode driving apparatus can drive the related art light emitting diode lamp string to light diversely.

When a certain related art light emitting diode lamp is damaged, the related art light emitting diode lamp does not light. The user will buy a new related art light emitting diode lamp, and the user will replace the damaged related art light emitting diode lamp with the new related art light emitting diode lamp. For example, when the related art light emitting diode lamp having the local address code 05 is damaged, the user will buy a new related art light emitting diode lamp (for example, having the local address code 30), and the user will replace the damaged related art light emitting diode lamp (having the local address code 05) with the new related art light emitting diode lamp (having the local address code 30).

However, the related art light emitting diode driving apparatus is not aware of the damaged related art light emitting diode lamp (having the local address code 05) being replaced with the new related art light emitting diode lamp (having the local address code 30), so that when the related art light emitting diode driving apparatus sends the related art driving lighting signal having the predetermined address code 05 to the related art light emitting diode lamps, none of the related art light emitting diode lamps lights based on the lighting code.

Hence, when the related art light emitting diode lamp having the local address code 05 is damaged, the user has to buy another new related art light emitting diode lamp having the local address code 05, and the user has to replace the damaged related art light emitting diode lamp having the local address code 05 with the new related art light emitting diode lamp having the local address code 05. Or, the user has to buy another new related art light emitting diode lamp string to replace the original related art light emitting diode lamp string, wherein in the original related art light emitting diode lamp string, the related art light emitting diode lamp having the local address code 05 is damaged. The user cannot optionally buy the related art light emitting diode lamp having the local address code unknown (or not 05) to replace the damaged related art light emitting diode lamp having the local address code 05.

SUMMARY OF THE INVENTION

In order to solve the above-mentioned problems, an object of the present invention is to provide a light emitting diode lamp string system with a sequencing function.

In order to solve the above-mentioned problems, another object of the present invention is to provide a sequencing method.

In order to achieve the object of the present invention mentioned above, the light emitting diode lamp string system of the present invention comprises a light emitting diode driving apparatus and at least one light emitting diode lamp string. The at least one light emitting diode lamp string is electrically connected to the light emitting diode driving apparatus. Moreover, the at least one light emitting diode lamp string comprises a plurality of light emitting diode lamps. The light emitting diode lamps are electrically connected to the light emitting diode driving apparatus. The light emitting diode lamps are electrically connected to each other. Moreover, when the light emitting diode driving apparatus is in a predetermined sequence testing mode: the light emitting diode driving apparatus is configured to generate a plurality of predetermined sequence testing signals; each of the predetermined sequence testing signals comprises a predetermined address code; the predetermined address codes are different; based on a testing sequence of the predetermined address codes, the light emitting diode driving apparatus is configured to sequentially send the predetermined sequence testing signals to the at least one light emitting diode lamp string, and the light emitting diode driving apparatus is configured to sequentially detect a consumed current of the at least one light emitting diode lamp string correspondingly; when the consumed current is less than or equal to a first current, the light emitting diode driving apparatus is configured to store and define the predetermined address code of the predetermined sequence testing signal corresponding to the consumed current less than or equal to the first current as a failure address code. Moreover, when the light emitting diode driving apparatus is in an extended sequence testing mode: the light emitting diode driving apparatus is configured to generate a plurality of extended sequence testing signals; each of the extended sequence testing signals comprises an extended address code; the extended address codes are different; the extended address codes and the predetermined address codes are different; the light emitting diode driving apparatus is configured to respectively send each of the extended sequence testing signals to the at least one light emitting diode lamp string, and the light emitting diode driving apparatus is configured to respectively detect the consumed current of the at least one light emitting diode lamp string correspondingly; when the consumed current is greater than or equal to a second current, the light emitting diode driving apparatus is configured to store and define the extended address code of the extended sequence testing signal corresponding to the consumed current greater than or equal to the second current as a replacement address code. Moreover, the light emitting diode driving apparatus is configured to replace the failure address code with the replacement address code in the testing sequence.

Moreover, in an embodiment of the light emitting diode lamp string system of the present invention mentioned above, each of the light emitting diode lamps comprises a local address code. The local address codes are different. Each of the predetermined sequence testing signals further comprises a testing lighting signal. Each of the extended sequence testing signals further comprises the testing lighting signal. When the light emitting diode driving apparatus sequentially sends the predetermined sequence testing signals to the light emitting diode lamps of the at least one light emitting diode lamp string, if the predetermined address code of the predetermined sequence testing signal received by the light emitting diode lamp is the same with the local address code of the light emitting diode lamp, the light emitting diode lamp is configured to light to generate the consumed current based on the testing lighting signal of the predetermined sequence testing signal received by the light emitting diode lamp. When the light emitting diode driving apparatus respectively sends each of the extended sequence testing signals to the light emitting diode lamps of the at least one light emitting diode lamp string, if the extended address code of the extended sequence testing signal received by the light emitting diode lamp is the same with the local address code of the light emitting diode lamp, the light emitting diode lamp is configured to light to generate the consumed current based on the testing lighting signal of the extended sequence testing signal received by the light emitting diode lamp.

Moreover, in an embodiment of the light emitting diode lamp string system of the present invention mentioned above, the light emitting diode driving apparatus comprises a transmitting side controller and a transmitting side switch. The transmitting side switch is electrically connected to the transmitting side controller and the at least one light emitting diode lamp string. Moreover, the transmitting side controller is configured to control the transmitting side switch to generate the predetermined sequence testing signals and the extended sequence testing signals.

Moreover, in an embodiment of the light emitting diode lamp string system of the present invention mentioned above, the light emitting diode driving apparatus further comprises a transmitting side memory and a test button. The transmitting side memory is electrically connected to the transmitting side controller. The test button is electrically connected to the transmitting side controller. Moreover, the transmitting side memory is configured to store the testing sequence, the failure address code and the replacement address code. When the test button is pressed, the light emitting diode driving apparatus is configured to enter the predetermined sequence testing mode. After the light emitting diode driving apparatus finishes the predetermined sequence testing mode to leave from the predetermined sequence testing mode, the light emitting diode driving apparatus is configured to enter the extended sequence testing mode. After the light emitting diode driving apparatus finishes the extended sequence testing mode to leave from the extended sequence testing mode, the light emitting diode driving apparatus is configured to replace the failure address code with the replacement address code in the testing sequence. Moreover, the transmitting side memory and the transmitting side controller can be integrated as a controller which comprises a memory inside the controller.

Moreover, in an embodiment of the light emitting diode lamp string system of the present invention mentioned above, the light emitting diode driving apparatus further comprises a current detector and a radio frequency receiver. The current detector is electrically connected to the transmitting side controller and the transmitting side switch. The radio frequency receiver is electrically connected to the transmitting side controller and the current detector. Moreover, the current detector is configured to detect the consumed current of the at least one light emitting diode lamp string to inform the transmitting side controller of the consumed current of the at least one light emitting diode lamp string. The radio frequency receiver is configured to receive a wireless remote signal to control the transmitting side controller.

Moreover, in an embodiment of the light emitting diode lamp string system of the present invention mentioned above, each of the light emitting diode lamps comprises a voltage division circuit and a receiving side driver. The voltage division circuit is electrically connected to the light emitting diode driving apparatus. The receiving side driver is electrically connected to the voltage division circuit. Moreover, the voltage division circuit is configured to reduce a power supplied by the light emitting diode driving apparatus to supply power to the receiving side driver. The receiving side driver is configured to determine whether the predetermined address code of the predetermined sequence testing signal received by the light emitting diode lamp is the same with the local address code of the light emitting diode lamp or not, and the receiving side driver is configured to determine whether the extended address code of the extended sequence testing signal received by the light emitting diode lamp is the same with the local address code of the light emitting diode lamp or not. The receiving side driver is configured to store the local address code.

Moreover, in an embodiment of the light emitting diode lamp string system of the present invention mentioned above, the voltage division circuit comprises a first resistor, a second resistor, a first Zener diode, a second Zener diode, a diode and a capacitor. The first resistor is electrically connected to the light emitting diode driving apparatus and the receiving side driver. The second resistor is electrically connected to the receiving side driver and the first resistor. The first Zener diode is electrically connected to the receiving side driver, the first resistor and the second resistor. The second Zener diode is electrically connected to the second resistor. The diode is electrically connected to the receiving side driver, the first resistor, the second resistor, the first Zener diode and the second Zener diode. The capacitor is electrically connected to the second resistor, the second Zener diode and the diode.

Moreover, in an embodiment of the light emitting diode lamp string system of the present invention mentioned above, each of the light emitting diode lamps further comprises a third resistor, a fourth resistor, a fifth resistor, a first transistor switch, a second transistor switch, a third transistor switch, a first light emitting diode, a second light emitting diode, a third light emitting diode, a sixth resistor, a seventh resistor and an eighth resistor. The third resistor is electrically connected to the receiving side driver. The fourth resistor is electrically connected to the receiving side driver. The fifth resistor is electrically connected to the receiving side driver. The first transistor switch is electrically connected to the third resistor. The second transistor switch is electrically connected to the fourth resistor. The third transistor switch is electrically connected to the fifth resistor. The first light emitting diode is electrically connected to the first transistor switch. The second light emitting diode is electrically connected to the second transistor switch. The third light emitting diode is electrically connected to the third transistor switch. The sixth resistor is electrically connected to the first light emitting diode, the first resistor and the light emitting diode driving apparatus. The seventh resistor is electrically connected to the second light emitting diode, the first resistor and the light emitting diode driving apparatus. The eighth resistor is electrically connected to the third light emitting diode, the first resistor and the light emitting diode driving apparatus.

Moreover, in an embodiment of the light emitting diode lamp string system of the present invention mentioned above, each of the light emitting diode lamps comprises a voltage stabilizer and a logic controller. The voltage stabilizer is electrically connected to the light emitting diode driving apparatus. The logic controller is electrically connected to the voltage stabilizer. Moreover, before the light emitting diode driving apparatus enters the predetermined sequence testing mode and the extended sequence testing mode, a driving voltage of the voltage stabilizer is reduced, so that each of the light emitting diode lamps is configured to work at a voltage that the voltage stabilizer is not turned on.

Moreover, in an embodiment of the light emitting diode lamp string system of the present invention mentioned above, each of the light emitting diode lamps comprises a voltage stabilizer and a logic controller. The voltage stabilizer is electrically connected to the light emitting diode driving apparatus. The logic controller is electrically connected to the voltage stabilizer. Moreover, before the light emitting diode driving apparatus enters the predetermined sequence testing mode and the extended sequence testing mode, the light emitting diode driving apparatus is configured to send a command signal to the logic controller, so that the logic controller is configured to turn off the voltage stabilizer.

In order to achieve the object of the present invention mentioned above, the sequencing method of the present invention comprises following steps. A predetermined sequence testing mode is performed to detect a failure address code. An extended sequence testing mode is performed to detect a replacement address code. The failure address code is replaced with the replacement address code in a testing sequence. Moreover, performing the predetermined sequence testing mode comprises following steps. A plurality of predetermined sequence testing signals is generated, wherein each of the predetermined sequence testing signals comprises a predetermined address code, and the predetermined address codes are different. The predetermined sequence testing signals are sequentially sent to a light emitting diode lamp string based on the testing sequence of the predetermined address codes to detect a consumed current of the light emitting diode lamp string, wherein the predetermined address codes are sequentially arranged based on magnitudes of the predetermined address codes in the testing sequence, wherein the light emitting diode lamp string comprises a plurality of light emitting diode lamps, and the light emitting diode lamps are electrically connected to each other. The predetermined address code of the predetermined sequence testing signal corresponding to the consumed current less than or equal to a first current is recorded as the failure address code if the consumed current is less than or equal to the first current. Moreover, performing the extended sequence testing mode comprises following steps. A plurality of extended sequence testing signals is generated, wherein each of the extended sequence testing signals comprises an extended address code; the extended address codes are different; the extended address codes and the predetermined address codes are different. Each of the extended sequence testing signals is sent to the light emitting diode lamp string respectively to detect the consumed current of the light emitting diode lamp string. The extended address code of the extended sequence testing signal corresponding to the consumed current greater than or equal to a second current is recorded as the replacement address code if the consumed current is greater than or equal to the second current.

Moreover, in an embodiment of the sequencing method of the present invention mentioned above, each of the light emitting diode lamps comprises a local address code. The local address codes are different. Each of the predetermined sequence testing signals further comprises a testing lighting signal. Each of the extended sequence testing signals further comprises the testing lighting signal. When the predetermined sequence testing signals are sequentially sent to the light emitting diode lamps of the light emitting diode lamp string, if the predetermined address code of the predetermined sequence testing signal received by the light emitting diode lamp is the same with the local address code of the light emitting diode lamp, the light emitting diode lamp is configured to light to generate the consumed current based on the testing lighting signal of the predetermined sequence testing signal received by the light emitting diode lamp. When each of the extended sequence testing signals are respectively sent to the light emitting diode lamps of the light emitting diode lamp string, if the extended address code of the extended sequence testing signal received by the light emitting diode lamp is the same with the local address code of the light emitting diode lamp, the light emitting diode lamp is configured to light to generate the consumed current based on the testing lighting signal of the extended sequence testing signal received by the light emitting diode lamp.

The advantage of the present invention is to make the new light emitting diode lamp replace the damaged light emitting diode lamp to light correctly based on the contents of the driving lighting signal.

Please refer to the detailed descriptions and figures of the present invention mentioned below for further understanding the technology, method and effect of the present invention achieving the predetermined purposes. It believes that the purposes, characteristic and features of the present invention can be understood deeply and specifically. However, the figures are only for references and descriptions, but the present invention is not limited by the figures.

DETAILED DESCRIPTION OF THE INVENTION

Figure 1:
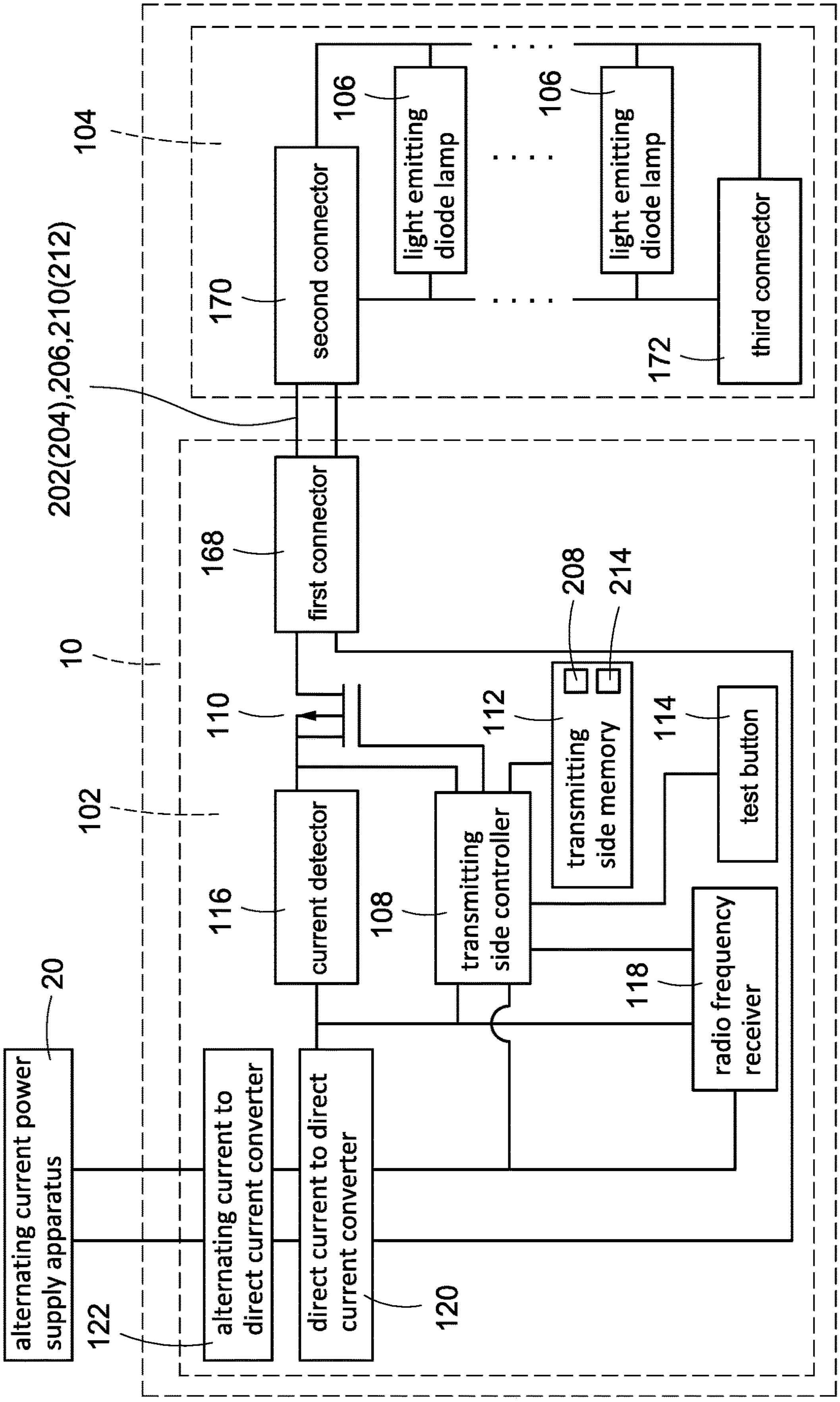
FIG. 1 shows a block diagram of an embodiment of the light emitting diode lamp string system of the present invention (parallel type).

In the present disclosure, numerous specific details are provided, to provide a thorough understanding of embodiments of the invention. Persons of ordinary skill in the art will recognize, however, that the present invention can be practiced without one or more of the specific details. In other instances, well-known details are not shown or described to avoid obscuring aspects of the present invention. Now please refer to the figures for the explanation of the technical content and the detailed description of the present invention:

FIG. 1 shows a block diagram of an embodiment of the light emitting diode lamp string system of the present invention (parallel type). A light emitting diode lamp string system 10 with a sequencing function is applied to an alternating current power supply apparatus 20. The light emitting diode lamp string system 10 comprises a light emitting diode driving apparatus 102 and at least one light emitting diode lamp string 104. The light emitting diode driving apparatus 102 comprises a transmitting side controller 108, a transmitting side switch 110, a transmitting side memory 112, a test button 114, a current detector 116, a radio frequency receiver 118, a direct current to direct current converter 120, an alternating current to direct current converter 122 and a first connector 168. The at least one light emitting diode lamp string 104 comprises a plurality of light emitting diode lamps 106, a second connector 170 and a third connector 172. The components mentioned above are electrically connected to each other. The light emitting diode lamps 106 are electrically connected to each other (namely, the light emitting diode lamps 106 are connected in parallel). The second connector 170 is connected to (for example, plugged into) the first connector 168. The transmitting side memory 112 and the transmitting side controller 108 can be integrated as a controller which comprises a memory inside the controller.

After the at least one light emitting diode lamp string 104 has been manufactured, each of the light emitting diode lamps 106 comprises a local address code. There are the light emitting diode lamps 106, so there are the local address codes. The local address codes of the light emitting diode lamps 106 are different. The light emitting diode lamps 106 are arranged orderly based on the local address codes. For example, if the at least one light emitting diode lamp string 104 comprises 25 light emitting diode lamps 106, the 25 light emitting diode lamps 106 comprise the local address codes 01, 02 . . . 25 respectively; the 25 light emitting diode lamps 106 are arranged orderly based on the local address codes 01, 02 . . . 25 from left to right in FIG. 1.

The at least one light emitting diode lamp string 104 is connected to the light emitting diode driving apparatus 102 through the first connector 168 and the second connector 170. The light emitting diode driving apparatus 102 drives the at least one light emitting diode lamp string 104 to light diversely. The method is as follows.

The transmitting side controller 108 controls the transmitting side switch 110 (to be turned on or off) to generate a driving lighting signal, wherein the driving lighting signal comprises a predetermined address code 204 and a lighting code. Then, the light emitting diode driving apparatus 102 sends the driving lighting signal to the light emitting diode lamps 106. All of the light emitting diode lamps 106 receive the driving lighting signal. If the local address code of the light emitting diode lamp 106 is the same with the predetermined address code 204 of the driving lighting signal, the light emitting diode lamp 106 lights based on the lighting code of the driving lighting signal. If the local address code of the light emitting diode lamp 106 is not the same with the predetermined address code 204 of the driving lighting signal, the light emitting diode lamp 106 ignores the lighting code of the driving lighting signal. The contents mentioned above can be referred to as the point control technology.

For example, if the predetermined address code 204 of the driving lighting signal is 05, the light emitting diode lamp 106 having the local address code 05 lights based on the lighting code of the driving lighting signal. The rest of the light emitting diode lamps 106 ignore the lighting code of the driving lighting signal. Therefore, the light emitting diode driving apparatus 102 can drive the at least one light emitting diode lamp string 104 to light diversely.

When a certain light emitting diode lamp 106 is damaged, the damaged light emitting diode lamp 106 does not light. The user will buy a new light emitting diode lamp 106, and the user will replace the damaged light emitting diode lamp 106 with the new light emitting diode lamp 106. For example, when the light emitting diode lamp 106 having the local address code 05 is damaged, the user will buy a new light emitting diode lamp 106 (for example, having the local address code 30), and the user will replace the damaged light emitting diode lamp 106 (having the local address code 05) with the new light emitting diode lamp 106 (having the local address code 30).

Therefore, there are two questions:

1. How is the light emitting diode driving apparatus 102 aware that the light emitting diode lamp 106 having the local address code 05 is damaged (removed)?

2. How is the light emitting diode driving apparatus 102 aware that the local address code of the new light emitting diode lamp 106 is 30?

If the light emitting diode driving apparatus 102 is aware that the light emitting diode lamp 106 having the local address code 05 is removed, and if the light emitting diode driving apparatus 102 is aware that the local address code of the new light emitting diode lamp 106 is 30, when the next time the light emitting diode driving apparatus 102 intends to drive the light emitting diode lamp 106 having the local address code 05 to light, the predetermined address code 204 of the driving lighting signal will become 30 (not 05).

For the first question mentioned above, the present invention provides a predetermined sequence testing mode to help the light emitting diode driving apparatus 102 find out the damaged (removed) light emitting diode lamp 106. The contents are as follows.

Firstly, the test button 114 is pressed, so that the light emitting diode driving apparatus 102 enters the predetermined sequence testing mode. When the light emitting diode driving apparatus 102 is in the predetermined sequence testing mode: the light emitting diode driving apparatus 102 generates a plurality of predetermined sequence testing signals 202, wherein each of the predetermined sequence testing signals 202 comprises the predetermined address code 204, and the predetermined address codes 204 are different. Based on a testing sequence of the predetermined address codes 204, the light emitting diode driving apparatus 102 sequentially sends the predetermined sequence testing signals 202 to the light emitting diode lamps 106 of the at least one light emitting diode lamp string 104, and the light emitting diode driving apparatus 102 sequentially detects a consumed current 206 of the at least one light emitting diode lamp string 104 correspondingly. When the consumed current 206 is less than or equal to a first current (for examples, OmA or 0.001 mA), the light emitting diode driving apparatus 102 stores and defines the predetermined address code 204 of the predetermined sequence testing signal 202 corresponding to the consumed current 206 less than or equal to the first current as a failure address code 208. Therefore, the light emitting diode driving apparatus 102 is aware that which light emitting diode lamp 106 is damaged (removed).

For example, the predetermined sequence testing signals 202 comprise the predetermined address codes (204) 01, 02 . . . 25 respectively. The testing sequence is 01, 02 . . . 25. Firstly, the light emitting diode driving apparatus 102 sends the predetermined sequence testing signal 202 having the predetermined address code (204) 01 to the light emitting diode lamps 106 of the at least one light emitting diode lamp string 104. At this time, the light emitting diode lamp 106 having the local address code 01 will light to generate the consumed current 206 (which is greater than the first current), so that the light emitting diode driving apparatus 102 is aware that the light emitting diode lamp 106 having the local address code 01 is normal.

Then, the light emitting diode driving apparatus 102 sends the predetermined sequence testing signal 202 having the predetermined address code (204) 02 to the light emitting diode lamps 106 of the at least one light emitting diode lamp string 104. At this time, the light emitting diode lamp 106 having the local address code 02 will light to generate the consumed current 206 (which is greater than the first current), so that the light emitting diode driving apparatus 102 is aware that the light emitting diode lamp 106 having the local address code 02 is normal.

And so on, until the light emitting diode driving apparatus 102 sends the predetermined sequence testing signal 202 having the predetermined address code (204) 05 to the light emitting diode lamps 106 of the at least one light emitting diode lamp string 104, because the light emitting diode lamp 106 having the local address code 05 is replaced, none of the light emitting diode lamps 106 will light, so the consumed current 206 of the at least one light emitting diode lamp string 104 will be less than or equal to the first current, so that the light emitting diode driving apparatus 102 is aware that the light emitting diode lamp 106 having the local address code 05 is removed. The light emitting diode driving apparatus 102 stores and defines/records the predetermined address code (204) 05 as the failure address code 208.

In an embodiment of the present invention, even if the light emitting diode driving apparatus 102 is aware that the light emitting diode lamp 106 having the local address code 05 is removed, the light emitting diode driving apparatus 102 still sends the predetermined sequence testing signals 202 having the predetermined address codes (204) 06~25 respectively to the light emitting diode lamps 106 of the at least one light emitting diode lamp string 104, and then the light emitting diode driving apparatus 102 leaves from the predetermined sequence testing mode. However, the present invention is not limited to it. Once the light emitting diode driving apparatus 102 is aware that the light emitting diode lamp 106 having the local address code 05 is removed, the present invention can leave from the predetermined sequence testing mode (namely, stop sending the predetermined sequence testing signals 202). However, sending the rest of the predetermined sequence testing signals 202 has an advantage: if another damaged (removed) light emitting diode lamp 106 is founded, the light emitting diode driving apparatus 102 can provide a warning message to inform the user that only one damaged light emitting diode lamp 106 can be removed at one time. Namely, if a quantity of the failure address code 208 is greater than or equal to 2, the light emitting diode driving apparatus 102 provides (namely, sends out) the warning message.

For the second question mentioned above, the present invention provides an extended sequence testing mode to help the light emitting diode driving apparatus 102 find out the new light emitting diode lamp 106. The contents are as follows.

After the light emitting diode driving apparatus 102 finishes the predetermined sequence testing mode to leave from the predetermined sequence testing mode, the light emitting diode driving apparatus 102 enters the extended sequence testing mode. When the light emitting diode driving apparatus 102 is in the extended sequence testing mode: the light emitting diode driving apparatus 102 generates a plurality of extended sequence testing signals 210. Each of the extended sequence testing signals 210 comprises an extended address code 212. The extended address codes 212 are different. The extended address codes 212 and the predetermined address codes 204 are different. The light emitting diode driving apparatus 102 respectively sends each of the extended sequence testing signals 210 to the at least one light emitting diode lamp string 104, and the light emitting diode driving apparatus 102 respectively detects the consumed current 206 of the at least one light emitting diode lamp string 104 correspondingly. When the consumed current 206 is greater than or equal to a second current (for examples, 100 mA or 200 mA, greater than the first current), the light emitting diode driving apparatus 102 stores and defines the extended address code 212 of the extended sequence testing signal 210 corresponding to the consumed current 206 greater than or equal to the second current as a replacement address code 214. Therefore, the light emitting diode driving apparatus 102 is aware that which light emitting diode lamp 106 is new.

For example, the extended sequence testing signals 210 comprise the extended address codes (212) 26, 27 . . . 32 respectively. Firstly, the light emitting diode driving apparatus 102 sends the extended sequence testing signal 210 having the extended address code (212) 26 to the light emitting diode lamps 106 of the at least one light emitting diode lamp string 104. At this time, because there is no light emitting diode lamp 106 having the local address code 26, none of the light emitting diode lamps 106 will light, so that the consumed current 206 of the at least one light emitting diode lamp string 104 is less than the second current. Therefore, the light emitting diode driving apparatus 102 is aware that there is no light emitting diode lamp 106 having the local address code 26.

Then, the light emitting diode driving apparatus 102 sends the extended sequence testing signal 210 having the extended address code (212) 27 to the light emitting diode lamps 106 of the at least one light emitting diode lamp string 104. At this time, because there is no light emitting diode lamp 106 having the local address code 27, none of the light emitting diode lamps 106 will light, so that the consumed current 206 of the at least one light emitting diode lamp string 104 is less than the second current. Therefore, the light emitting diode driving apparatus 102 is aware that there is no light emitting diode lamp 106 having the local address code 27.

And so on, until the light emitting diode driving apparatus 102 sends the extended sequence testing signal 210 having the extended address code (212) 30 to the light emitting diode lamps 106 of the at least one light emitting diode lamp string 104, because there is the light emitting diode lamp 106 having the local address code 30, the light emitting diode lamp 106 having the local address code 30 will light, so the consumed current 206 of the at least one light emitting diode lamp string 104 will be greater than or equal to the second current, so that the light emitting diode driving apparatus 102 is aware that the light emitting diode lamp 106 having the local address code 30 is added to the at least one light emitting diode lamp string 104. The light emitting diode driving apparatus 102 stores and defines/records the extended address code (212) 30 as the replacement address code 214.

In an embodiment of the present invention, the present invention utilizes a current difference to detect the new light emitting diode lamp 106. Namely, if none of the light emitting diode lamps 106 lights, a first specific current is obtained. Taking the embodiment mentioned above as an example, sending the extended sequence testing signal 210 having the extended address code (212) 30 obtains a second specific current. The second specific current minus the first specific current is the current difference mentioned above. If the current difference is greater than or equal to a specific value (for example, greater than or equal to the second current mentioned above), the light emitting diode driving apparatus 102 is aware that the light emitting diode lamp 106 having the local address code 30 is added to the at least one light emitting diode lamp string 104.

In an embodiment of the present invention, even if the light emitting diode driving apparatus 102 is aware that the light emitting diode lamp 106 having the local address code 30 is new, the light emitting diode driving apparatus 102 still sends the extended sequence testing signals 210 having the extended address codes (212) 31~32 respectively to the light emitting diode lamps 106 of the at least one light emitting diode lamp string 104, and then the light emitting diode driving apparatus 102 leaves from the extended sequence testing mode. However, the present invention is not limited to it. Once the light emitting diode driving apparatus 102 is aware that the light emitting diode lamp 106 having the local address code 30 is new, the present invention can leave from the extended sequence testing mode (namely, stop sending the extended sequence testing signals 210). However, sending the rest of the extended sequence testing signals 210 has an advantage: if another new light emitting diode lamp 106 is founded, the light emitting diode driving apparatus 102 can provide a warning message to inform the user that only one new light emitting diode lamp 106 can be added at one time. Namely, if a quantity of the replacement address code 214 is greater than or equal to 2, the light emitting diode driving apparatus 102 provides (namely, sends out) the warning message. Moreover, the extended address codes (212) 31~32 is just an example, and the extended address codes 212 can be 31~256, and so on.

After the light emitting diode driving apparatus 102 finishes the extended sequence testing mode to leave from the extended sequence testing mode, the light emitting diode driving apparatus 102 replaces the failure address code 208 with the replacement address code 214 in the testing sequence. Namely, the light emitting diode driving apparatus 102 replaces the predetermined address code (204) 05 with the extended address code (212) 30 in the testing sequence. The testing sequence will become 01, 02, 03, 04, 30, 06, 07, . . . , 25.

Therefore, when the next time the light emitting diode driving apparatus 102 intends to drive the light emitting diode lamp 106 having the local address code 05 to light, the predetermined address code 204 of the driving lighting signal will become 30 (not 05). Finally, in an embodiment of the present invention, the light emitting diode driving apparatus 102 can perform a reconfirm action: the light emitting diode driving apparatus 102 sequentially sends the predetermined sequence testing signals 202 (wherein the testing sequence is 01, 02, 03, 04, 30, 06, 07, . . . , 25) to the light emitting diode lamps 106 of the at least one light emitting diode lamp string 104, and the light emitting diode driving apparatus 102 sequentially detects the consumed current 206 of the at least one light emitting diode lamp string 104 correspondingly. If each of the consumed currents 206 is greater than the first current, the action that the failure address code 208 is replaced with the replacement address code 214 is performed successfully.

For another example, if the light emitting diode lamp 106 having the local address code 06 is also damaged, the user replaces the damaged light emitting diode lamp 106 having the local address code 06 with a new light emitting diode lamp 106 having the local address code 31. In order to make the light emitting diode driving apparatus 102 be aware that the light emitting diode lamp 106 having the local address code 06 is damaged, and in order to make the light emitting diode driving apparatus 102 be aware that the damaged light emitting diode lamp 106 having the local address code 06 is replaced with the new light emitting diode lamp 106 having the local address code 31, the contents are similar with the contents mentioned above:

The test button 114 is pressed, so that the light emitting diode driving apparatus 102 enters the predetermined sequence testing mode. The predetermined sequence testing signals 202 respectively have the predetermined address codes (204) 01, 02, 03, 04, 30, 06, . . . , 25. The testing sequence is 01, 02, 03, 04, 30, 06, . . . , 25. It is noted that 05 now is replaced with 30.

Firstly, the light emitting diode driving apparatus 102 sends the predetermined sequence testing signal 202 having the predetermined address code (204) 01 to the light emitting diode lamps 106 of the at least one light emitting diode lamp string 104. At this time, the light emitting diode lamp 106 having the local address code 01 will light to generate the consumed current 206 (which is greater than the first current), so that the light emitting diode driving apparatus 102 is aware that the light emitting diode lamp 106 having the local address code 01 is normal. Similarly, then the predetermined sequence testing signals 202 having the predetermined address codes (204) 02, 03, 04 are sent sequentially. Then, the predetermined sequence testing signal 202 having the predetermined address code (204) 30 is sent.

Then, the light emitting diode driving apparatus 102 sends the predetermined sequence testing signal 202 having the predetermined address code (204) 06 to the light emitting diode lamps 106 of the at least one light emitting diode lamp string 104. Because the light emitting diode lamp 106 having the local address code 06 is replaced, none of the light emitting diode lamps 106 will light, so the consumed current 206 of the at least one light emitting diode lamp string 104 will be less than or equal to the first current, so that the light emitting diode driving apparatus 102 is aware that the light emitting diode lamp 106 having the local address code 06 is removed. The light emitting diode driving apparatus 102 stores and defines/records the predetermined address code (204) 06 as the failure address code 208.

After the light emitting diode driving apparatus 102 finishes the predetermined sequence testing mode to leave from the predetermined sequence testing mode, the light emitting diode driving apparatus 102 enters the extended sequence testing mode. In the extended sequence testing mode, because the extended address code (212) 30 is used (wherein the light emitting diode driving apparatus 102 is aware of it), the extended sequence testing signals 210 respectively have extended address codes (212) 26, 27, 28, 29, 31, 32.

Firstly, the light emitting diode driving apparatus 102 sends the extended sequence testing signal 210 having the extended address code (212) 26 to the light emitting diode lamps 106 of the at least one light emitting diode lamp string 104. At this time, because there is no light emitting diode lamp 106 having the local address code 26, none of the light emitting diode lamps 106 will light, so that the consumed current 206 of the at least one light emitting diode lamp string 104 is less than the second current. Therefore, the light emitting diode driving apparatus 102 is aware that there is no light emitting diode lamp 106 having the local address code 26. Similarly, then the extended sequence testing signals 210 having the extended address codes (212) 27, 28, 29 are sent sequentially. Then, the extended sequence testing signal 210 having the extended address code (212) 31 is sent.

When the light emitting diode driving apparatus 102 sends the extended sequence testing signal 210 having the extended address code (212) 31 to the light emitting diode lamps 106 of the at least one light emitting diode lamp string 104, because there is the light emitting diode lamp 106 having the local address code 31, the light emitting diode lamp 106 having the local address code 31 will light, so the consumed current 206 of the at least one light emitting diode lamp string 104 will be greater than or equal to the second current, so that the light emitting diode driving apparatus 102 is aware that the light emitting diode lamp 106 having the local address code 31 is added to the at least one light emitting diode lamp string 104. The light emitting diode driving apparatus 102 stores and defines/records the extended address code (212) 31 as the replacement address code 214.

After the light emitting diode driving apparatus 102 finishes the extended sequence testing mode to leave from the extended sequence testing mode, the light emitting diode driving apparatus 102 replaces the failure address code 208 with the replacement address code 214 in the testing sequence. Namely, the light emitting diode driving apparatus 102 replaces the predetermined address code (204) 06 with the extended address code (212) 31 in the testing sequence. The testing sequence will become 01, 02, 03, 04, 30, 31, 07, . . . , 25. Therefore, when the next time the light emitting diode driving apparatus 102 intends to drive the light emitting diode lamp 106 having the local address code 06 to light, the predetermined address code 204 of the driving lighting signal will become 31 (not 06).

Moreover, each of the predetermined sequence testing signals 202 mentioned above further comprises a testing lighting signal. Each of the extended sequence testing signals 210 mentioned above further comprises the testing lighting signal. When the light emitting diode driving apparatus 102 sequentially sends the predetermined sequence testing signals 202 to the light emitting diode lamps 106 of the at least one light emitting diode lamp string 104, if the predetermined address code 204 of the predetermined sequence testing signal 202 received by the light emitting diode lamp 106 is the same with the local address code of the light emitting diode lamp 106, the light emitting diode lamp 106 lights to generate the consumed current 206 based on the testing lighting signal of the predetermined sequence testing signal 202 received by the light emitting diode lamp 106. When the light emitting diode driving apparatus 102 respectively sends each of the extended sequence testing signals 210 to the light emitting diode lamps 106 of the at least one light emitting diode lamp string 104, if the extended address code 212 of the extended sequence testing signal 210 received by the light emitting diode lamp 106 is the same with the local address code of the light emitting diode lamp 106, the light emitting diode lamp 106 lights to generate the consumed current 206 based on the testing lighting signal of the extended sequence testing signal 210 received by the light emitting diode lamp 106. Moreover, in order to maximize the consumed current 206 to help detect the current mentioned above, the testing lighting signal drives all of the light emitting diodes in the light emitting diode lamp 106 to light. For example, if the light emitting diode lamp 106 comprises a red emitting diode (not shown in FIG. 1), a green emitting diode (not shown in FIG. 1) and a blue emitting diode (not shown in FIG. 1), the red emitting diode, the green emitting diode and the blue emitting diode are driven together to emit the white light.

Moreover, the alternating current power supply apparatus 20 sends an alternating current power to the alternating current to direct current converter 122. The alternating current to direct current converter 122 receives the alternating current power and converts the alternating current power into a first direct current power. The alternating current to direct current converter 122 sends the first direct current power to the direct current to direct current converter 120. The direct current to direct current converter 120 converts the first direct current power into a second direct current power. The direct current to direct current converter 120 sends the second direct current power to the light emitting diode driving apparatus 102. The transmitting side controller 108 controls the transmitting side switch 110 (to be turned on or off) to generate the predetermined sequence testing signals 202 mentioned above and the extended sequence testing signals 210 mentioned above. The transmitting side memory 112 stores the testing sequence mentioned above, the failure address code 208 mentioned above and the replacement address code 214 mentioned above. The current detector 116 detects the consumed current 206 of the at least one light emitting diode lamp string 104 to inform the transmitting side controller 108 of the consumed current 206 of the at least one light emitting diode lamp string 104. The current detector 116 can comprise resistor components and so on. The radio frequency receiver 118 receives a wireless remote signal to control the transmitting side controller 108.

The third connector 172 is connected to another light emitting diode lamp string 104. A plurality of the light emitting diode lamp strings 104 in series can be controlled by a single light emitting diode driving apparatus 102. A quantity of the light emitting diode lamp strings 104 in series can be maximized based on the requirement and the local voltage supply.

Figure 2:
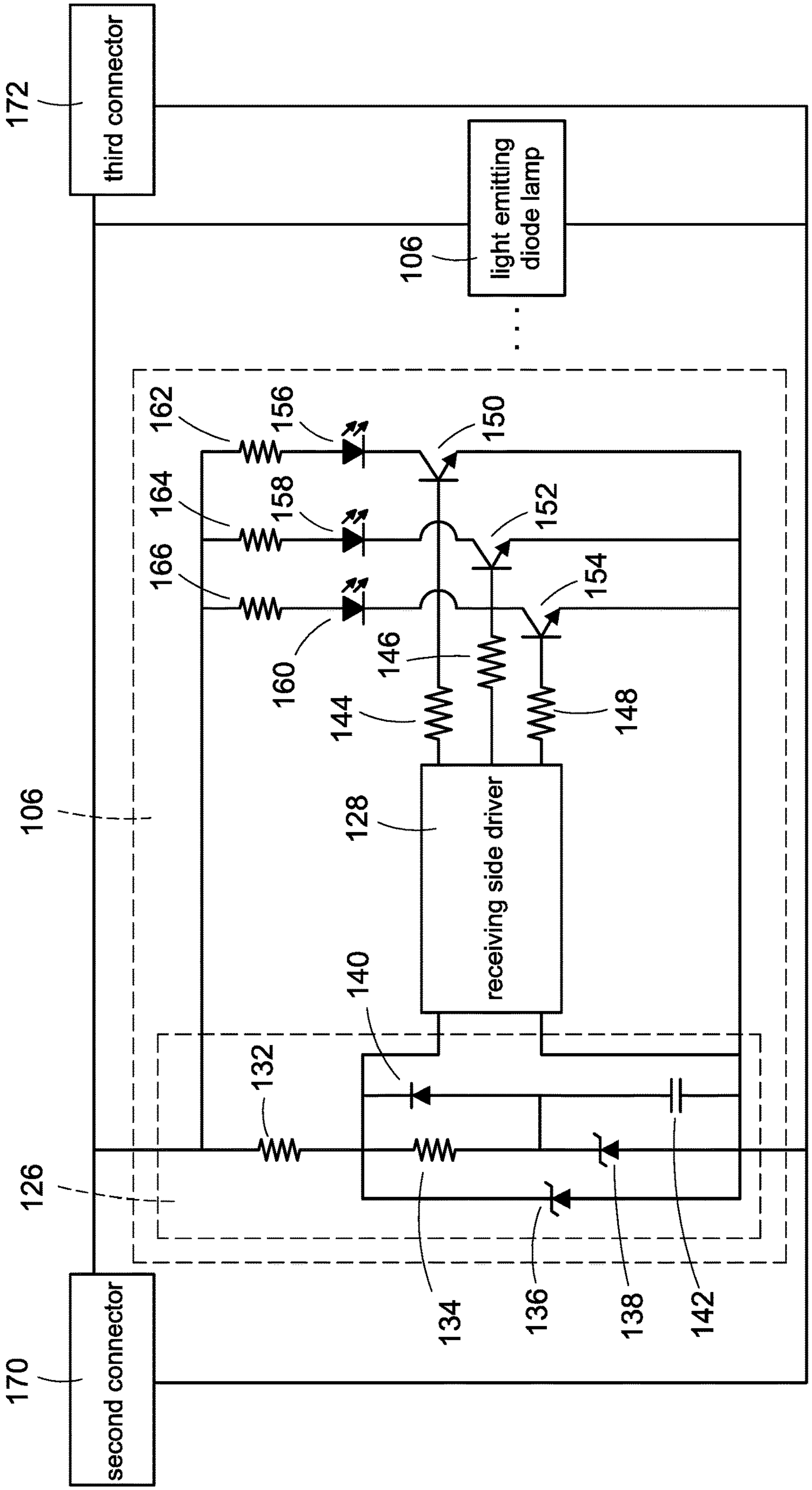
FIG. 2 shows a circuit block diagram of the light emitting diode lamp of the present invention (parallel type).

FIG. 2 shows a circuit block diagram of the light emitting diode lamp of the present invention (parallel type). The light emitting diode lamp 106 shown in FIG. 2 is applied to FIG. 1. Each of the light emitting diode lamps 106 comprises a voltage division circuit 126, a receiving side driver 128, a third resistor 144, a fourth resistor 146, a fifth resistor 148, a first transistor switch 150, a second transistor switch 152, a third transistor switch 154, a first light emitting diode 156, a second light emitting diode 158, a third light emitting diode 160, a sixth resistor 162, a seventh resistor 164 and an eighth resistor 166. The voltage division circuit 126 comprises a first resistor 132, a second resistor 134, a first Zener diode 136, a second Zener diode 138, a diode 140 and a capacitor 142. The components mentioned above are electrically connected to each other.

To be more specific, one side of the first resistor 132 is connected to the light emitting diode driving apparatus 102. The other side of the first resistor 132 is connected to the receiving side driver 128. One side of the second resistor 134 is connected to the receiving side driver 128 and the other side of the first resistor 132. A cathode of the first Zener diode 136 is connected to the receiving side driver 128, the other side of the first resistor 132 and one side of the second resistor 134. An anode of the first Zener diode 136 is connected to the receiving side driver 128 and the light emitting diode driving apparatus 102. A cathode of the second Zener diode 138 is connected to the other side of the second resistor 134. An anode of the second Zener diode 138 is connected to the receiving side driver 128, the light emitting diode driving apparatus 102 and the anode of the first Zener diode 136. A cathode of the diode 140 is connected to the receiving side driver 128, the other side of the first resistor 132, one side of the second resistor 134 and the cathode of the first Zener diode 136. An anode of the diode 140 is connected to the other side of the second resistor 134 and the cathode of the second Zener diode 138. One side of the capacitor 142 is connected to the other side of the second resistor 134, the cathode of the second Zener diode 138 and the anode of the diode 140. The other side of the capacitor 142 is connected to the receiving side driver 128, the light emitting diode driving apparatus 102, the anode of the first Zener diode 136 and the anode of the second Zener diode 138.

The receiving side driver 128 determines whether the predetermined address code 204 of the predetermined sequence testing signal 202 received by the light emitting diode lamp 106 is the same with the local address code of the light emitting diode lamp 106 or not. If the receiving side driver 128 determines that the predetermined address code 204 of the predetermined sequence testing signal 202 received by the light emitting diode lamp 106 is the same with the local address code of the light emitting diode lamp 106, the receiving side driver 128 drives the first light emitting diode 156, the second light emitting diode 158 and the third light emitting diode 160 to light to generate the consumed current 206 based on the testing lighting signal of the predetermined sequence testing signal 202 received by the light emitting diode lamp 106.

The receiving side driver 128 determines whether the extended address code 212 of the extended sequence testing signal 210 received by the light emitting diode lamp 106 is the same with the local address code of the light emitting diode lamp 106 or not. If the receiving side driver 128 determines that the extended address code 212 of the extended sequence testing signal 210 received by the light emitting diode lamp 106 is the same with the local address code of the light emitting diode lamp 106, the receiving side driver 128 drives the first light emitting diode 156, the second light emitting diode 158 and the third light emitting diode 160 to light to generate the consumed current 206 based on the testing lighting signal of the extended sequence testing signal 210 received by the light emitting diode lamp 106.

The receiving side driver 128 determines whether the predetermined address code 204 of the driving lighting signal received by the light emitting diode lamp 106 is the same with the local address code of the light emitting diode lamp 106 or not. If the receiving side driver 128 determines that the predetermined address code 204 of the driving lighting signal received by the light emitting diode lamp 106 is the same with the local address code of the light emitting diode lamp 106, the receiving side driver 128 drives the first light emitting diode 156, the second light emitting diode 158 and/or the third light emitting diode 160 to light based on the lighting code of the driving lighting signal received by the light emitting diode lamp 106.

The voltage division circuit 126 reduces a power (namely, stabilizes the voltage) supplied by the light emitting diode driving apparatus 102 to supply power to the receiving side driver 128. The receiving side driver 128 stores the local address code.

Figure 3:
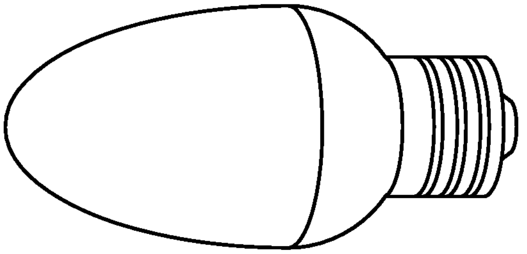
FIG. 3 shows an appearance picture of the light emitting diode lamp of the present invention.

FIG. 3 shows an appearance picture of the light emitting diode lamp of the present invention. The light emitting diode lamp 106 is a light emitting diode bulb and is arranged in a lamp holder (not shown in FIG. 3) of the light emitting diode lamp string 104.

Please refer to FIG. 1 again. The third connector 172 is connected to the second connector 170 of another light emitting diode lamp string 104. When a plurality of the light emitting diode lamp strings 104 is connected in series through the second connectors 170 and the third connectors 172, if a certain light emitting diode lamp 106 of a certain light emitting diode lamp string 104 is replaced with a new light emitting diode lamp 106, the sequencing method of the present invention comprises following contents.

Firstly, the transmitting side controller 108 is aware of the consumed current 206 (for example, 125 mA) of one light emitting diode lamp string 104 when none of the light emitting diode lamps 106 of the light emitting diode lamp string 104 lights. Namely, when none of the light emitting diode lamps 106 of the light emitting diode lamp string 104 lights, the consumed current 206 of the light emitting diode lamp string 104 is 125 mA. Therefore, when the light emitting diode lamp string system 10 is connected to the alternating current power supply apparatus 20, the light emitting diode driving apparatus 102 does not drive any of the light emitting diode lamp strings 104, and the light emitting diode driving apparatus 102 utilizes the current detector 116 to detect the consumed current 206 to calculate a quantity of the light emitting diode lamp strings 104. For example, if the consumed current 206 is 375 mA at this time, the quantity of the light emitting diode lamp strings 104 will be 3 (namely, 375/125=3).

Then, it is similar with the method mentioned above, but the standard of the consumed current 206 mentioned above becomes a multiple of the quantity of the light emitting diode lamp strings 104, for example, triple. Therefore, for example, when only double of the standard of the consumed current 206 mentioned above is detected, the replaced light emitting diode lamp 106 is found. Finally, about finding out the new light emitting diode lamp 106, it is similar with the contents mentioned above, and would be omitted here for brevity.

In other words, in an embodiment of the present invention, the light emitting diode lamp string system 10 comprises N light emitting diode lamp strings 104, wherein the N is an integer greater than 1. The N light emitting diode lamp strings 104 are connected to each other in series. When the light emitting diode driving apparatus 102 is in a lamp string quantity detection mode: the light emitting diode driving apparatus 102 is configured to stop driving the light emitting diode lamps 106 of the N light emitting diode lamp strings 104 to detect the consumed current 206 of the N light emitting diode lamp strings 104, and the light emitting diode driving apparatus 102 is configured to calculate a quantity of the N light emitting diode lamp strings 104 is the N.

When the light emitting diode driving apparatus 102 is in the predetermined sequence testing mode: based on the testing sequence of the predetermined address codes 204, the light emitting diode driving apparatus 102 sequentially sends the predetermined sequence testing signals 202 to the N light emitting diode lamp strings 104, and the light emitting diode driving apparatus 102 sequentially detects the consumed current 206 of the N light emitting diode lamp strings 104 correspondingly. When the consumed current 206 is less than or equal to the N times of the first current, the light emitting diode driving apparatus 102 is configured to store and define the predetermined address code 204 of the predetermined sequence testing signal 202 corresponding to the consumed current 206 less than or equal to the N times of the first current as the failure address code 208.

When the light emitting diode driving apparatus 102 is in the extended sequence testing mode: the light emitting diode driving apparatus 102 is configured to respectively send each of the extended sequence testing signals 210 to the N light emitting diode lamp strings 104, and the light emitting diode driving apparatus 102 is configured to respectively detect the consumed current 206 of the N light emitting diode lamp strings 104 correspondingly. When the consumed current 206 is greater than or equal to the second current, the light emitting diode driving apparatus 102 is configured to store and define the extended address code 212 of the extended sequence testing signal 210 corresponding to the consumed current 206 greater than or equal to the second current as the replacement address code 214. The other contents are similar with the contents mentioned above, and would be omitted here for brevity.

Figure 5:
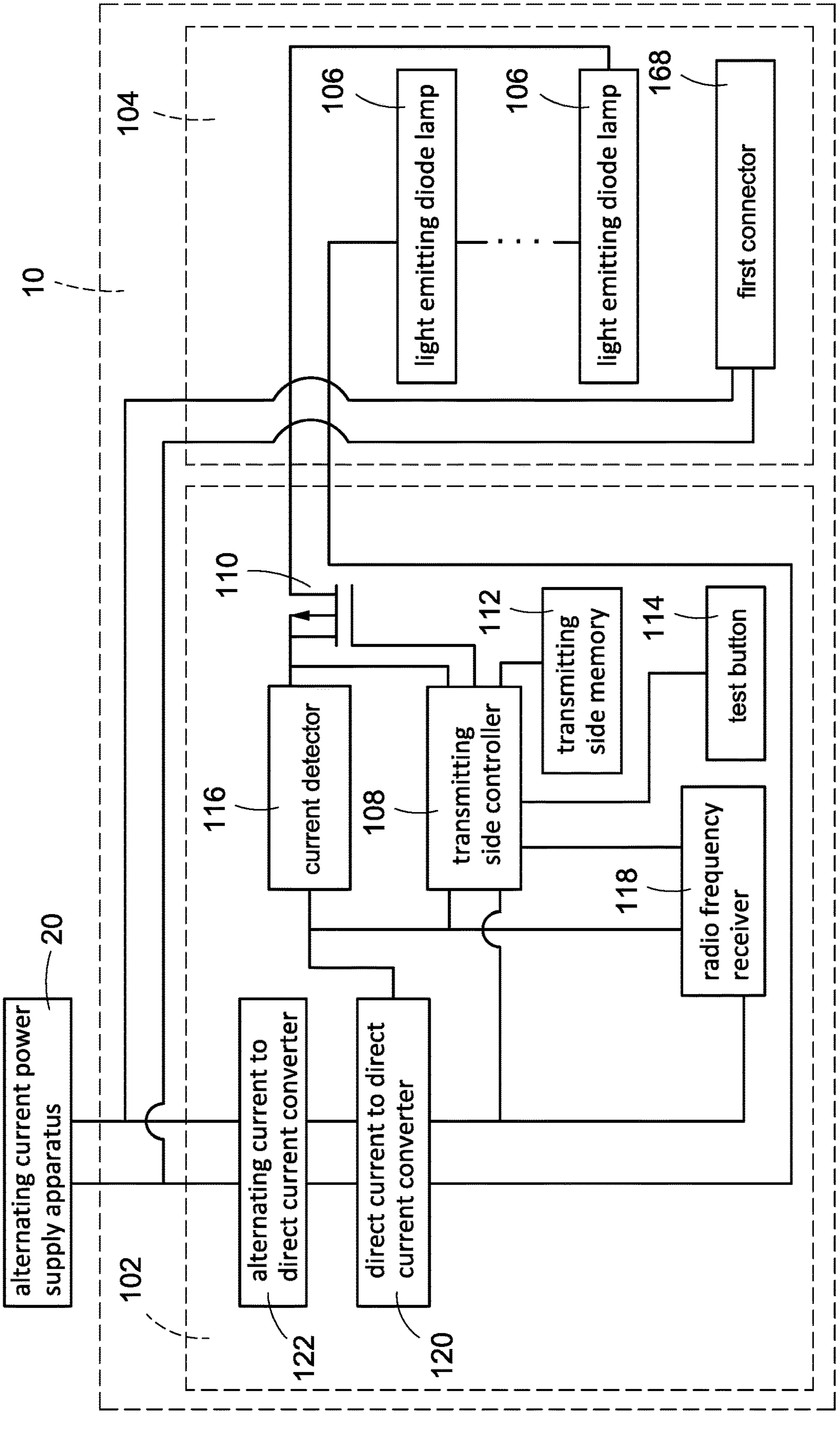
FIG. 5 shows a block diagram of another embodiment of the light emitting diode lamp string system of the present invention (serial type).
Figure 8:
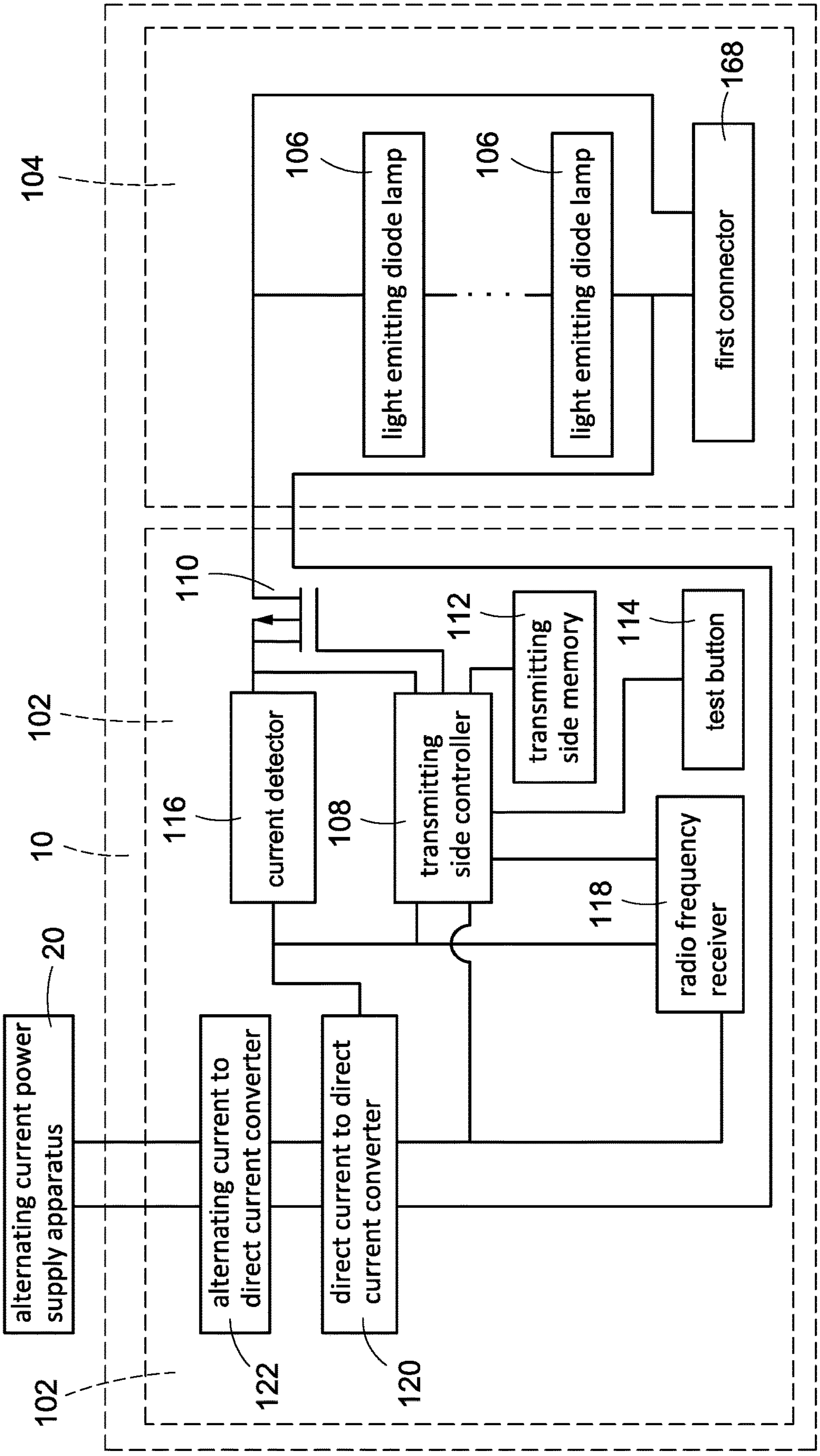
FIG. 8 shows a block diagram of still another embodiment of the light emitting diode lamp string system of the present invention (serial type).

FIG. 5 shows a block diagram of another embodiment of the light emitting diode lamp string system of the present invention (serial type). FIG. 8 shows a block diagram of still another embodiment of the light emitting diode lamp string system of the present invention (serial type). In FIG. 5 and FIG. 8, the light emitting diode lamps 106 are connected to each other in series. The other contents of FIG. 5 and FIG. 8 are similar with the contents mentioned above, and would be omitted here for brevity.

Figure 6:
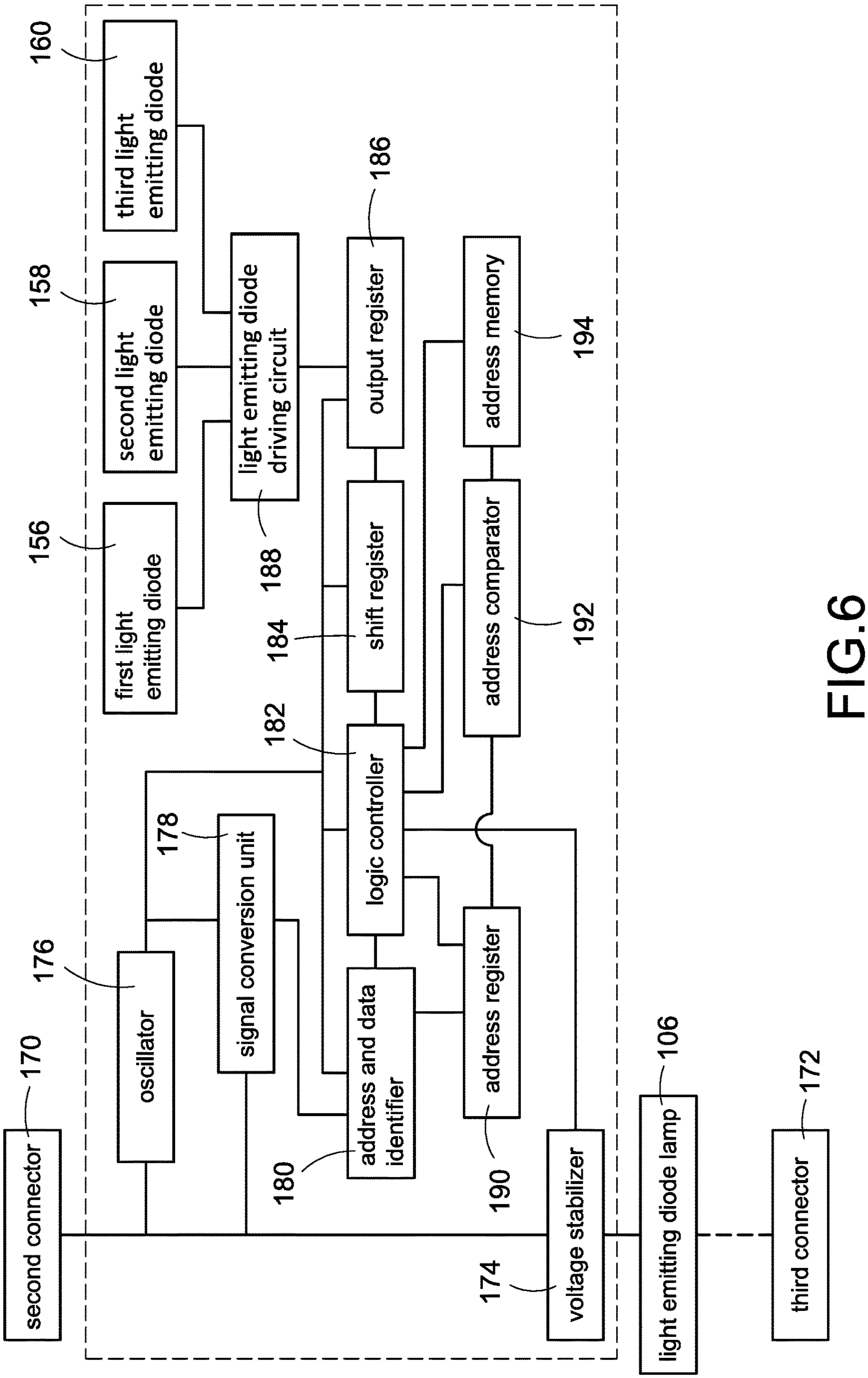
FIG. 6 shows a circuit block diagram of the light emitting diode lamp of the present invention (serial type).

FIG. 6 shows a circuit block diagram of the light emitting diode lamp of the present invention (serial type). The light emitting diode lamp 106 shown in FIG. 6 is applied to FIG. 5 and FIG. 8. Each of the light emitting diode lamps 106 comprises a voltage stabilizer 174, an oscillator 176, a signal conversion unit 178, an address and data identifier 180, a logic controller 182, a shift register 184, an output register 186, a light emitting diode driving circuit 188, an address register 190, an address comparator 192, an address memory 194, a first light emitting diode 156, a second light emitting diode 158 and a third light emitting diode 160. The components mentioned above are electrically connected to each other.

Figure 7:
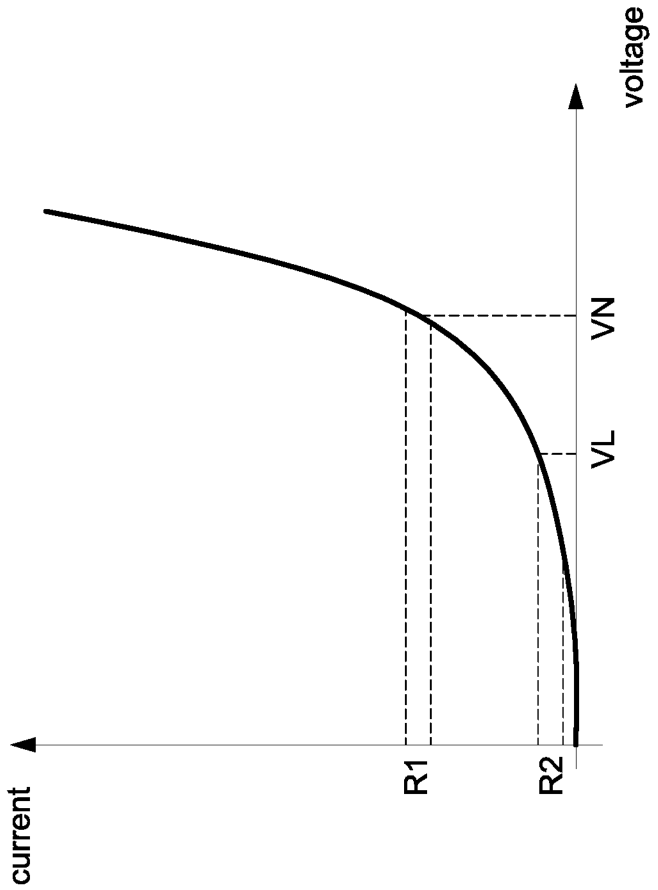
FIG. 7 shows a voltage current curve diagram of the voltage stabilizer of the present invention.

FIG. 7 shows a voltage current curve diagram of the voltage stabilizer of the present invention. Please refer to FIG. 5, FIG. 6 and FIG. 8 at the same time. The voltage stabilizer 174 can be, for example, a Zener diode. If the voltage stabilizer 174 works normally, the light emitting diode lamp 106 works to proceed the lighting or non-lighting (consuming current or not consuming current) of the first light emitting diode 156, the second light emitting diode 158 and the third light emitting diode 160. A voltage change which results from such current change is not great. Therefore, the current detector 116 cannot effectively detect the current consumption. For example, near a voltage VN in FIG. 7, the voltage change corresponding to a first current region R1 is not great.

In order to increase the voltage change, the voltage stabilizer 174 has to stop working. If the voltage stabilizer 174 stops working, when the light emitting diode lamp 106 lights or does not light, the current change will result in a greater voltage change, so that the current detector 116 can effectively detect the current consumption to inform the transmitting side controller 108. For example, before a voltage VL in FIG. 7, the voltage change corresponding to a second current region R2 is greater, wherein the first current region R1 is equal to the second current region R2. Obviously, the voltage change corresponding to the second current region R2 is greater than the voltage change corresponding to the first current region R1.

There are two methods to make the voltage stabilizer 174 stop working: one method is to reduce a driving voltage of the voltage stabilizer 174, so that the voltage stabilizer 174 stops working; the other method is that the light emitting diode driving apparatus 102 sends a command signal to the logic controller 182, so that the logic controller 182 is configured to turn off the voltage stabilizer 174.

To be more specific, compared with the parallel method, the serial method adds the voltage stabilizer 174. The main purpose is to make each of the light emitting diode lamps 106 in the series path maintain at a near/similar voltage. Because colors of the light emitting diode lamps 106 are not the same, the equivalent impedances are not the same; the voltage stabilizer 174 is to adjust this issue/trouble; this function will conflict with the above-mentioned method that utilizes the current difference to determine which lamp does not light and what the new lamp is. Therefore, when entering the detection mode, there are two methods to make the voltage stabilizer 174 stop working:

1. Before entering the predetermined sequence testing mode and the extended sequence testing mode, the driving voltage of the voltage stabilizer 174 is reduced, so that each of the light emitting diode lamps 106 is configured to work at the voltage VL that the voltage stabilizer 174 is not turned on. Namely, make the voltage stabilizer 174 fail.

2. Before entering the predetermined sequence testing mode and the extended sequence testing mode, the light emitting diode driving apparatus 102 sends the command signal to the logic controller 182, so that the logic controller 182 is configured to turn off the voltage stabilizer 174.

Moreover, the other contents of the serial type are the same with the contents of the parallel type mentioned above. Furthermore, because the serial type does not have the problem which has to reduce the high direct current voltage to supply power to the electronic components as the parallel type, the integrated/one-piece lamp bead can be used. Moreover, the circuit of the serial type is easier as well.

Figure 4:
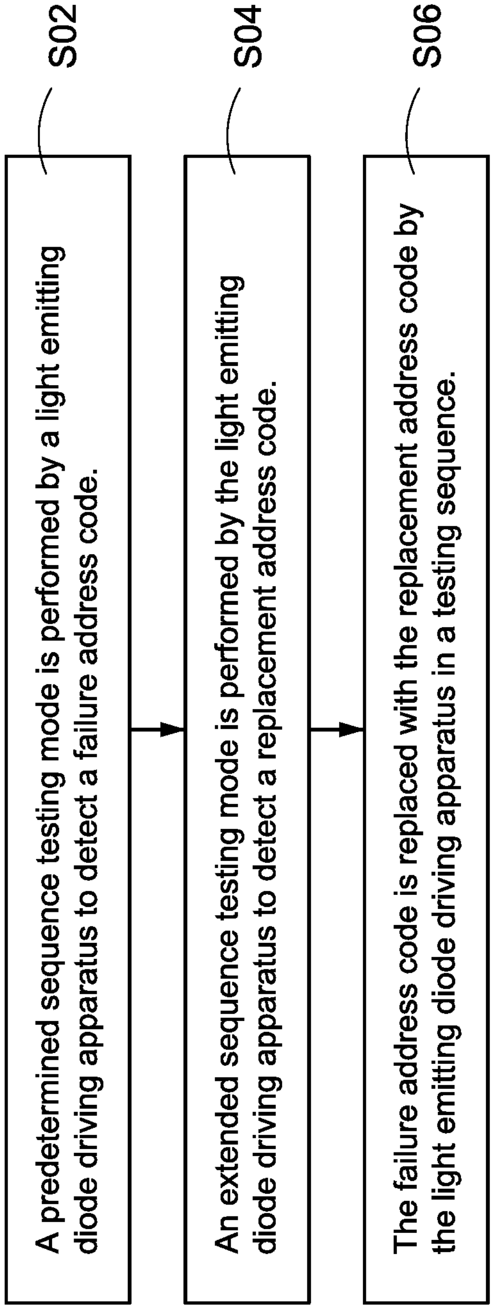
FIG. 4 shows a flow chart of the sequencing method of the present invention.

FIG. 4 shows a flow chart of the sequencing method of the present invention. A sequencing method of the present invention comprises following steps:

Step 02: a predetermined sequence testing mode is performed by a light emitting diode driving apparatus to detect a failure address code. Then, the sequencing method enters the Step 04.

Step 04: an extended sequence testing mode is performed by the light emitting diode driving apparatus to detect a replacement address code. Then, the sequencing method enters the Step 06.

Step 06: the failure address code is replaced with the replacement address code by the light emitting diode driving apparatus in a testing sequence.

Moreover, performing the predetermined sequence testing mode by the light emitting diode driving apparatus comprises following steps. A plurality of predetermined sequence testing signals is generated by the light emitting diode driving apparatus, wherein each of the predetermined sequence testing signals comprises a predetermined address code, and the predetermined address codes are different. The predetermined sequence testing signals are sequentially sent to a light emitting diode lamp string by the light emitting diode driving apparatus based on the testing sequence of the predetermined address codes to detect a consumed current of the light emitting diode lamp string by the light emitting diode driving apparatus, wherein the predetermined address codes are sequentially arranged based on magnitudes of the predetermined address codes in the testing sequence, wherein the light emitting diode lamp string comprises a plurality of light emitting diode lamps, and the light emitting diode lamps are electrically connected to each other (namely, it can be the parallel connection or the serial connection). The predetermined address code of the predetermined sequence testing signal corresponding to the consumed current less than or equal to a first current is recorded as the failure address code by the light emitting diode driving apparatus if the consumed current is less than or equal to the first current.

Moreover, performing the extended sequence testing mode by the light emitting diode driving apparatus comprises following steps. A plurality of extended sequence testing signals is generated by the light emitting diode driving apparatus, wherein each of the extended sequence testing signals comprises an extended address code; the extended address codes are different; the extended address codes and the predetermined address codes are different. Each of the extended sequence testing signals are sent to the light emitting diode lamp string by the light emitting diode driving apparatus to detect the consumed current of the light emitting diode lamp string by the light emitting diode driving apparatus. The extended address code of the extended sequence testing signal corresponding to the consumed current greater than or equal to a second current is recorded as the replacement address code by the light emitting diode driving apparatus if the consumed current is greater than or equal to the second current.

Moreover, each of the light emitting diode lamps comprises a local address code. The local address codes are different. Each of the predetermined sequence testing signals further comprises a testing lighting signal. Each of the extended sequence testing signals further comprises the testing lighting signal. When the predetermined sequence testing signals are sequentially sent to the light emitting diode lamps of the light emitting diode lamp string by the light emitting diode driving apparatus, if the predetermined address code of the predetermined sequence testing signal received by the light emitting diode lamp is the same with the local address code of the light emitting diode lamp, the light emitting diode lamp lights to generate the consumed current based on the testing lighting signal of the predetermined sequence testing signal received by the light emitting diode lamp. When each of the extended sequence testing signals are respectively sent to the light emitting diode lamps of the light emitting diode lamp string by the light emitting diode driving apparatus, if the extended address code of the extended sequence testing signal received by the light emitting diode lamp is the same with the local address code of the light emitting diode lamp, the light emitting diode lamp lights to generate the consumed current based on the testing lighting signal of the extended sequence testing signal received by the light emitting diode lamp.

The other contents of the sequencing method of the present invention are similar with the contents mentioned above, and would be omitted here for brevity.

The advantage of the present invention is to make the new light emitting diode lamp replace the damaged light emitting diode lamp to light correctly based on the contents of the driving lighting signal.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A light emitting diode lamp string system with a sequencing function comprising:

a light emitting diode driving apparatus; and at least one light emitting diode lamp string electrically connected to the light emitting diode driving apparatus, wherein the at least one light emitting diode lamp string comprises:

a plurality of light emitting diode lamps electrically connected to the light emitting diode driving apparatus, and electrically connected to each other, wherein when the light emitting diode driving apparatus is in a predetermined sequence testing mode: the light emitting diode driving apparatus is configured to generate a plurality of predetermined sequence testing signals; each of the predetermined sequence testing signals comprises a predetermined address code; the predetermined address codes are different; based on a testing sequence of the predetermined address codes, the light emitting diode driving apparatus is configured to sequentially send the predetermined sequence testing signals to the at least one light emitting diode lamp string, and the light emitting diode driving apparatus is configured to sequentially detect a consumed current of the at least one light emitting diode lamp string correspondingly; when the consumed current is less than or equal to a first current, the light emitting diode driving apparatus is configured to store and define the predetermined address code of the predetermined sequence testing signal corresponding to the consumed current less than or equal to the first current as a failure address code;

wherein when the light emitting diode driving apparatus is in an extended sequence testing mode: the light emitting diode driving apparatus is configured to generate a plurality of extended sequence testing signals; each of the extended sequence testing signals comprises an extended address code; the extended address codes are different; the extended address codes and the predetermined address codes are different; the light emitting diode driving apparatus is configured to respectively send each of the extended sequence testing signals to the at least one light emitting diode lamp string, and the light emitting diode driving apparatus is configured to respectively detect the consumed current of the at least one light emitting diode lamp string correspondingly; when the consumed current is greater than or equal to a second current, the light emitting diode driving apparatus is configured to store and define the extended address code of the extended sequence testing signal corresponding to the consumed current greater than or equal to the second current as a replacement address code;

wherein the light emitting diode driving apparatus is configured to replace the failure address code with the replacement address code in the testing sequence.

2. The light emitting diode lamp string system in claim 1, wherein each of the light emitting diode lamps comprises a local address code; the local address codes are different; each of the predetermined sequence testing signals further comprises a testing lighting signal; each of the extended sequence testing signals further comprises the testing lighting signal; when the light emitting diode driving apparatus sequentially sends the predetermined sequence testing signals to the light emitting diode lamps of the at least one light emitting diode lamp string, if the predetermined address code of the predetermined sequence testing signal received by the light emitting diode lamp is the same with the local address code of the light emitting diode lamp, the light emitting diode lamp is configured to light to generate the consumed current based on the testing lighting signal of the predetermined sequence testing signal received by the light emitting diode lamp; when the light emitting diode driving apparatus respectively sends each of the extended sequence testing signals to the light emitting diode lamps of the at least one light emitting diode lamp string, if the extended address code of the extended sequence testing signal received by the light emitting diode lamp is the same with the local address code of the light emitting diode lamp, the light emitting diode lamp is configured to light to generate the consumed current based on the testing lighting signal of the extended sequence testing signal received by the light emitting diode lamp.

3. The light emitting diode lamp string system in claim 2, wherein each of the light emitting diode lamps comprises:

a voltage division circuit electrically connected to the light emitting diode driving apparatus; and a receiving side driver electrically connected to the voltage division circuit, wherein the voltage division circuit is configured to reduce a power supplied by the light emitting diode driving apparatus to supply power to the receiving side driver; the receiving side driver is configured to determine whether the predetermined address code of the predetermined sequence testing signal received by the light emitting diode lamp is the same with the local address code of the light emitting diode lamp or not; the receiving side driver is configured to determine whether the extended address code of the extended sequence testing signal received by the light emitting diode lamp is the same with the local address code of the light emitting diode lamp or not; the receiving side driver is configured to store the local address code.

4. The light emitting diode lamp string system in claim 3, wherein the voltage division circuit comprises:

a first resistor electrically connected to the light emitting diode driving apparatus and the receiving side driver;

a second resistor electrically connected to the receiving side driver and the first resistor;

a first zener diode electrically connected to the receiving side driver, the first resistor and the second resistor;

a second zener diode electrically connected to the second resistor;

a diode electrically connected to the receiving side driver, the first resistor, the second resistor, the first zener diode and the second zener diode; and a capacitor electrically connected to the second resistor, the second zener diode and the diode.

5. The light emitting diode lamp string system in claim 4, wherein each of the light emitting diode lamps further comprises:

a third resistor electrically connected to the receiving side driver;

a fourth resistor electrically connected to the receiving side driver;

a fifth resistor electrically connected to the receiving side driver;

a first transistor switch electrically connected to the third resistor;

a second transistor switch electrically connected to the fourth resistor;

a third transistor switch electrically connected to the fifth resistor;

a first light emitting diode electrically connected to the first transistor switch;

a second light emitting diode electrically connected to the second transistor switch;

a third light emitting diode electrically connected to the third transistor switch;

a sixth resistor electrically connected to the first light emitting diode, the first resistor and the light emitting diode driving apparatus;

a seventh resistor electrically connected to the second light emitting diode, the first resistor and the light emitting diode driving apparatus; and an eighth resistor electrically connected to the third light emitting diode, the first resistor and the light emitting diode driving apparatus.

6. The light emitting diode lamp string system in claim 2, wherein each of the light emitting diode lamps comprises:

a voltage stabilizer electrically connected to the light emitting diode driving apparatus; and a logic controller electrically connected to the voltage stabilizer, wherein before the light emitting diode driving apparatus enters the predetermined sequence testing mode and the extended sequence testing mode, a driving voltage of the voltage stabilizer is reduced, so that each of the light emitting diode lamps is configured to work at a voltage that the voltage stabilizer is not turned on.

7. The light emitting diode lamp string system in claim 2, wherein each of the light emitting diode lamps comprises:

a voltage stabilizer electrically connected to the light emitting diode driving apparatus; and a logic controller electrically connected to the voltage stabilizer, wherein before the light emitting diode driving apparatus enters the predetermined sequence testing mode and the extended sequence testing mode, the light emitting diode driving apparatus is configured to send a command signal to the logic controller, so that the logic controller is configured to turn off the voltage stabilizer.

8. The light emitting diode lamp string system in claim 1, wherein the light emitting diode driving apparatus comprises:

a transmitting side controller; and a transmitting side switch electrically connected to the transmitting side controller and the at least one light emitting diode lamp string, wherein the transmitting side controller is configured to control the transmitting side switch to generate the predetermined sequence testing signals and the extended sequence testing signals.

9. The light emitting diode lamp string system in claim 8, wherein light emitting diode driving apparatus further comprises:

a transmitting side memory electrically connected to the transmitting side controller; and a test button electrically connected to the transmitting side controller, wherein the transmitting side memory is configured to store the testing sequence, the failure address code and the replacement address code; when the test button is pressed, the light emitting diode driving apparatus is configured to enter the predetermined sequence testing mode; after the light emitting diode driving apparatus finishes the predetermined sequence testing mode to leave from the predetermined sequence testing mode, the light emitting diode driving apparatus is configured to enter the extended sequence testing mode; after the light emitting diode driving apparatus finishes the extended sequence testing mode to leave from the extended sequence testing mode, the light emitting diode driving apparatus is configured to replace the failure address code with the replacement address code in the testing sequence.

10. The light emitting diode lamp string system in claim 8, wherein the light emitting diode driving apparatus further comprises:

a current detector electrically connected to the transmitting side controller and the transmitting side switch; and a radio frequency receiver electrically connected to the transmitting side controller and the current detector, wherein the current detector is configured to detect the consumed current of the at least one light emitting diode lamp string to inform the transmitting side controller of the consumed current of the at least one light emitting diode lamp string; the radio frequency receiver is configured to receive a wireless remote signal to control the transmitting side controller.

11. A sequencing method comprising:

performing a predetermined sequence testing mode to detect a failure address code;

performing an extended sequence testing mode to detect a replacement address code; and replacing the failure address code with the replacement address code in a testing sequence, wherein performing the predetermined sequence testing mode comprises:

generating a plurality of predetermined sequence testing signals, wherein each of the predetermined sequence testing signals comprises a predetermined address code, wherein the predetermined address codes are different;

sending the predetermined sequence testing signals sequentially to a light emitting diode lamp string based on the testing sequence of the predetermined address codes to detect a consumed current of the light emitting diode lamp string, wherein the light emitting diode lamp string comprises a plurality of light emitting diode lamps, wherein the light emitting diode lamps are electrically connected to each other; and recording the predetermined address code of the predetermined sequence testing signal corresponding to the consumed current less than or equal to a first current as the failure address code if the consumed current is less than or equal to the first current, wherein performing the extended sequence testing mode comprises:

generating a plurality of extended sequence testing signals, wherein each of the extended sequence testing signals comprises an extended address code, wherein the extended address codes are different, wherein the extended address codes and the predetermined address codes are different;

sending each of the extended sequence testing signals to the light emitting diode lamp string respectively to detect the consumed current of the light emitting diode lamp string; and recording the extended address code of the extended sequence testing signal corresponding to the consumed current greater than or equal to a second current as the replacement address code if the consumed current is greater than or equal to the second current.

12. The sequencing method in claim 11, wherein each of the light emitting diode lamps comprises a local address code; the local address codes are different; each of the predetermined sequence testing signals further comprises a testing lighting signal; each of the extended sequence testing signals further comprises the testing lighting signal; when the predetermined sequence testing signals are sequentially sent to the light emitting diode lamps of the light emitting diode lamp string, if the predetermined address code of the predetermined sequence testing signal received by the light emitting diode lamp is the same with the local address code of the light emitting diode lamp, the light emitting diode lamp is configured to light to generate the consumed current based on the testing lighting signal of the predetermined sequence testing signal received by the light emitting diode lamp; when each of the extended sequence testing signals are respectively sent to the light emitting diode lamps of the light emitting diode lamp string, if the extended address code of the extended sequence testing signal received by the light emitting diode lamp is the same with the local address code of the light emitting diode lamp, the light emitting diode lamp is configured to light to generate the consumed current based on the testing lighting signal of the extended sequence testing signal received by the light emitting diode lamp.

* * * * *